United States Patent
Miura et al.

(10) Patent No.: US 10,132,871 B2
(45) Date of Patent: Nov. 20, 2018

(54) BATTERY SYSTEM

(71) Applicant: HITACHI AUTOMOTIVE SYSTEMS, LTD., Hitachinaka-shi, Ibaraki (JP)

(72) Inventors: Hikaru Miura, Hitachinaka (JP); Mutsumi Kikuchi, Hitachinaka (JP); Akihiko Kudoh, Hitachinaka (JP); Tomonori Kanai, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 15/874,548

(22) Filed: Jan. 18, 2018

(65) Prior Publication Data

US 2018/0143260 A1 May 24, 2018

Related U.S. Application Data

(63) Continuation of application No. 14/784,141, filed as application No. PCT/JP2013/061187 on Apr. 15, 2013, now Pat. No. 9,897,662.

(51) Int. Cl.
*H02J 1/10* (2006.01)
*G01R 31/36* (2006.01)
(Continued)

(52) U.S. Cl.
CPC ............ *G01R 31/3658* (2013.01); *B60L 3/12* (2013.01); *B60L 11/1853* (2013.01);
(Continued)

(58) Field of Classification Search
CPC ......... B60L 3/12; B60L 11/1853; G01R 15/22
(Continued)

(56) References Cited

U.S. PATENT DOCUMENTS

2006/0007614 A1* 1/2006 Pozzuoli ................. G06F 1/182
361/62
2010/0270859 A1 10/2010 Gong
(Continued)

FOREIGN PATENT DOCUMENTS

EP 126 282 A1 8/2001
GB 2 453 207 A 4/2009
(Continued)

OTHER PUBLICATIONS

Japanese Office Action dated Mar. 20, 2018 for the Japanese Patent Application No. 2017-107413.
(Continued)

*Primary Examiner* — Thomas Skibinski
(74) *Attorney, Agent, or Firm* — Volpe and Koenig, P.C.

(57) ABSTRACT

A battery system includes a battery module having a plurality of assembled batteries. Battery monitoring circuits are provided to correspond to each of the assembled batteries of the battery module. A control circuit controls operation of the battery monitoring circuits. A first signal transmission path transmits signals that are input and output between the battery monitoring circuits and the control circuit. A first isolation element is connected to the control circuit, and a second isolation element is connected to the battery monitoring circuit. The first signal transmission path is isolated from the control circuit by the second isolation element. The electrical potential of the first signal transmission path is a floating potential in relation to the electrical potentials of the control circuit and battery monitoring circuits.

6 Claims, 4 Drawing Sheets

(51) Int. Cl.
  *G01R 15/22* (2006.01)
  *B60L 11/18* (2006.01)
  *B60L 3/12* (2006.01)
  *H01M 10/48* (2006.01)
  *H02J 7/00* (2006.01)
  *H01M 10/42* (2006.01)

(52) U.S. Cl.
  CPC ......... *G01R 15/22* (2013.01); *G01R 31/3606* (2013.01); *H01M 10/482* (2013.01); *H02J 1/10* (2013.01); *H02J 7/0021* (2013.01); *B60L 2240/547* (2013.01); *B60L 2240/549* (2013.01); *G01R 31/3689* (2013.01); *H01M 2010/4278* (2013.01); *H01M 2220/20* (2013.01); *Y02T 10/7005* (2013.01); *Y02T 10/705* (2013.01)

(58) Field of Classification Search
  USPC ........ 307/43, 77, 82, 83; 320/116, 118, 134, 320/136
  See application file for complete search history.

(56) References Cited

U.S. PATENT DOCUMENTS

| | | | |
|---|---|---|---|
| 2011/0298424 A1* | 12/2011 | Yamauchi | B60L 3/0046 320/118 |
| 2012/0133330 A1 | 5/2012 | Kamata et al. | |
| 2013/0002016 A1 | 1/2013 | Furukawa et al. | |
| 2013/0019037 A1 | 1/2013 | Flippin et al. | |
| 2013/0187610 A1 | 7/2013 | Hayashi et al. | |
| 2014/0152261 A1 | 6/2014 | Yamauchi et al. | |

FOREIGN PATENT DOCUMENTS

| | | |
|---|---|---|
| JP | 01-103098 | 4/1989 |
| JP | 2000-173674 A | 6/2000 |
| JP | 2007-248092 A | 9/2007 |
| JP | 2007-278913 A | 10/2007 |
| JP | 2012-115100 A | 6/2012 |
| JP | 2012-244794 A | 12/2012 |
| JP | 2012-251979 A | 12/2012 |
| JP | 2013-027298 A | 2/2013 |
| JP | 2013-153596 A | 8/2013 |
| WO | 2012/053426 A1 | 4/2012 |
| WO | 2012-164761 A1 | 12/2012 |

OTHER PUBLICATIONS

Extended European Search Report dated Dec. 8, 2016 in EP Application No. 13882518.7.
Japanese Office Action dated May 22, 2018 for the Japanese Patent Application No. 2017-107413.

* cited by examiner

BATTERY SYSTEM

CROSS REFERENCE TO RELATED APPLICATION

This application is a continuation of U.S. patent application Ser. No. 14/784,141 filed Oct. 13, 2015, which is a 371 national stage application of PCT/JP2013/061187, filed Apr. 15, 2013 which is incorporated by reference as if fully set forth.

TECHNICAL FIELD

The present invention relates to a battery system.

BACKGROUND ART

Conventionally, a battery system has been known that is provided with monitoring circuits for each assembled battery block in which a plurality of battery cells are connected together in series and monitors the status of the assembled battery by outputting a predetermined instruction signal to each monitoring circuit from a microprocessor. In such a battery system, to isolate the microprocessor from the monitoring circuit, photo couplers as isolation elements are provided (see PTL 1).

CITATION LIST

Patent Literature

PTL 1: JP 2007-278913 A

SUMMARY OF INVENTION

Technical Problem

An isolation method such as disclosed in PTL 1, the photo coupler is connected to the assembled battery having a high voltage. Therefore, for example, if the microprocessor and the monitoring circuit are away from each other, wiring with high voltage is required to be routed across a long distance, which may cause a safety issue. Accordingly, in view of these problems, the main object of the present invention is to provide a safe and highly reliable battery system.

Solution to Problem

A battery system according to the present invention includes: a battery module in which a plurality of assembled batteries each having a plurality of battery cells is connected together; battery monitoring circuits that are provided so as to correspond to each of the assembled batteries of the battery module and monitor a status of each of the battery cells of the assembled batteries; a control circuit for controlling operation of the battery monitoring circuits; a first signal transmission path for transmitting signals that are input and output between the battery monitoring circuits and the control circuit; a first isolation element connected to the control circuit; and a second isolation element connected to the battery monitoring circuit. In the battery system, the first signal transmission path is isolated from the control circuit by the first isolation element and is isolated from the battery monitoring circuit by the second isolation element, and an electrical potential of the first signal transmission path is a floating potential in relation to an electrical potential of the control circuit and electrical potentials of the battery monitoring circuits.

Advantageous Effect of Invention

According to the present invention, a safe and highly reliable battery system can be provided.

DESCRIPTION OF EMBODIMENTS

First Embodiment

Figure 1:
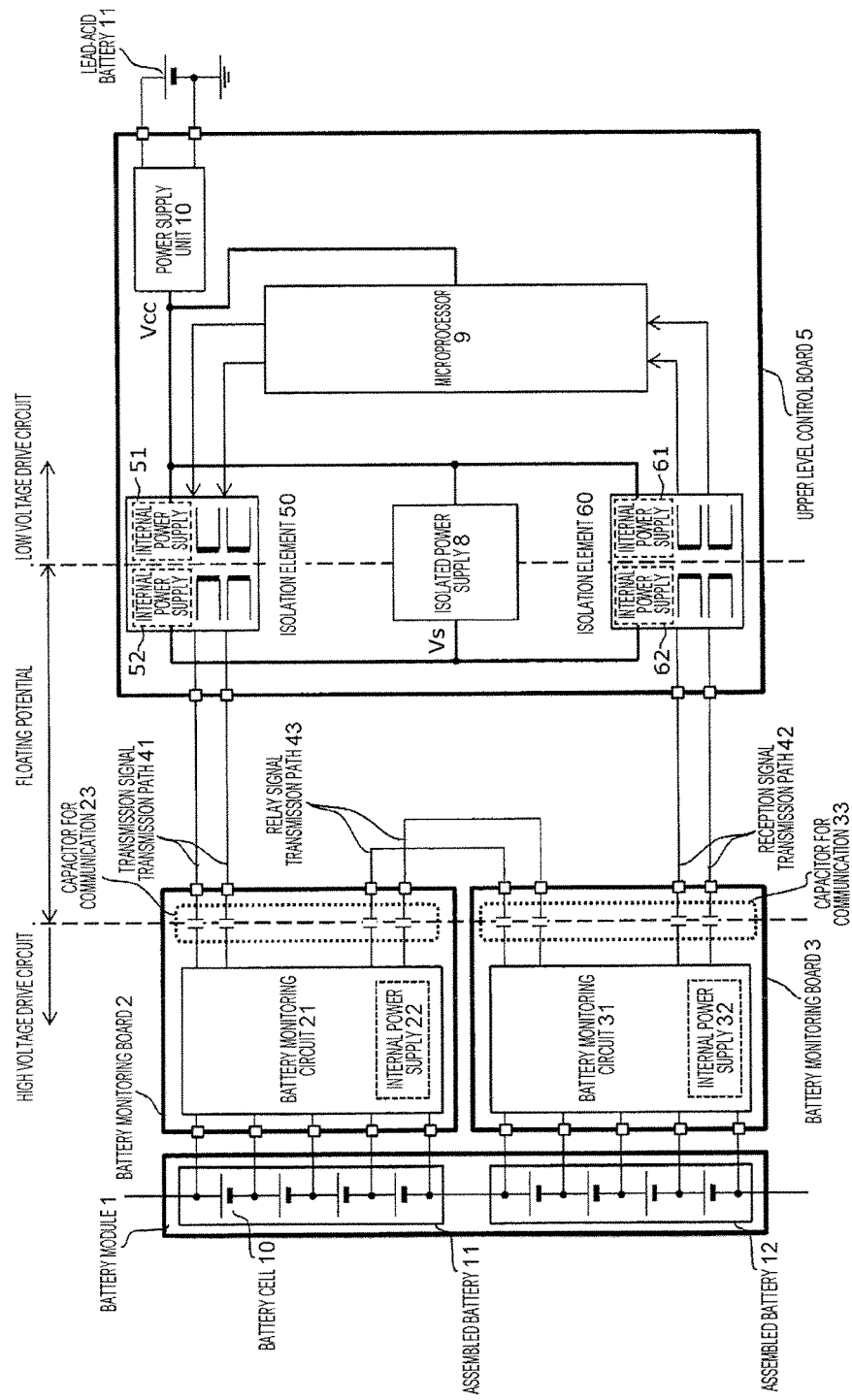
FIG. 1 illustrates a configuration of a battery system according to a first embodiment of the present invention.

FIG. 1 illustrates a configuration of a battery system according to a first embodiment of the present invention. The battery system is provided with a battery module 1, a battery monitoring board 2, a battery monitoring board 3, and an upper level control board 5. The battery monitoring boards 2, 3 respectively have battery monitoring circuits 21, 31 and capacitors for communication 23, 33. The upper level control board 5 has an isolation element 50, an isolation element 60, an isolated power supply 8, a microprocessor 9, and a power supply unit 10.

The battery monitoring board 2 and the upper level control board 5 are connected to each other via a transmission signal transmission path 41. The transmission signal transmission path 41 is a signal transmission path for transmitting signals that are input and output between the microprocessor 9 in the upper level control board 5 and the battery monitoring circuit 21 in the battery monitoring board 2. The battery monitoring board 3 and the upper level control board 5 are connected to each other via a reception signal transmission path 42. The reception signal transmission path 42 is a signal transmission path for transmitting signals that are input and output between the battery monitoring circuit 31 in the battery monitoring board 3 and the microprocessor 9 in the upper level control board 5. Incidentally, although the transmission signal transmission path 41 and the reception signal transmission path 42 each are illustrated as a two-wire differential signal transmission path in FIG. 1, each of them can be configured as a single-wire signal transmission path.

The battery module 1 is configured such that assembled batteries 11, 12 each having a plurality of battery cells 10 are connected together in series. The assembled battery 11 is connected to the battery monitoring board 2, and the assembled battery 12 is connected to the battery monitoring board 3.

The battery monitoring board 2 has the battery monitoring circuit 21 provided so as to correspond to the assembled battery 11. The battery monitoring circuit 21 measures the voltage of each of the battery cells 10 of the assembled battery 11 and the like depending on a command from the microprocessor 9 provided to the upper level control board 5. On the basis of the measurement result, the battery monitoring circuit 21 monitors the status of each of the battery cells 10 of the assembled battery 11. An internal power supply 22 is incorporated in the battery monitoring circuit 21. The internal power supply 22 generates operation power of the battery monitoring circuit 21 by using the power supplied from each of the battery cells 10 of the assembled battery 11.

The battery monitoring board 3 has the battery monitoring circuit 31 provided so as to correspond to the assembled battery 12. The battery monitoring circuit 31 measures the voltage of each of the battery cells 10 of the assembled battery 12 and the like depending on a command from the microprocessor 9 provided to the upper level control board 5. On the basis of the measurement result, the battery monitoring circuit 31 monitors the status of each of the battery cells 10 of the assembled battery 12. An internal power supply 32 is incorporated in the battery monitoring circuit 31. The internal power supply 32 generates operation power of the battery monitoring circuit 31 by using the power supplied from each of the battery cells 10 of the assembled battery 12.

The battery monitoring board 2 and the battery monitoring board 3 are connected to each other via a relay signal transmission path 43. The relay signal transmission path 43 is a transmission path for transmitting relay signals that are input and output between the battery monitoring circuit 21 and the battery monitoring circuit 31. The relay signal transmission path 43 is connected to the battery monitoring circuit 21 via the capacitor for communication 23 in the battery monitoring board 2, and is connected to the battery monitoring circuit 31 via the capacitor for communication 33 in the battery monitoring board 3. That is, the relay signal transmission path 43 is isolated from the battery monitoring circuits 21, 31 by the capacitors for communication 23, 33, respectively. Thus, the electrical potential of the relay signal transmission path 43 is a floating potential in relation to each electrical potential of the battery monitoring circuits 21, 31. Furthermore, the relay signal transmission path 43 has a floating potential in relation to the electrical potential of the microprocessor 9 in the upper level control board 5. The relay signals used for monitoring the status of each of the assembled batteries 11, 12 are transmitted and received between the battery monitoring circuit 21 and the battery monitoring circuit 31 via the relay signal transmission path 43. Incidentally, although each of the relay signal transmission paths 43 is illustrated as a two-wire differential signal transmission path in FIG. 1, it can be configured as a single-wire signal transmission path.

In the upper level control board 5, the microprocessor 9 is a circuit for controlling operation of the battery monitoring circuits 21, 31 and transmits a predetermined command signal to the battery monitoring circuits 21, 31 via the isolation element 50 and the transmission signal transmission path 41. By receiving the command signal, the battery monitoring circuits 21, 31 each execute operation depending on the command content from the microprocessor 9. Incidentally, the command signal to the battery monitoring circuit 31 from the microprocessor 9 is once received in the battery monitoring circuit 21, and then is transmitted to the battery monitoring circuit 31 as a relay signal via the relay signal transmission path 43.

The microprocessor 9 receives a measurement signal transmitted via the reception signal transmission path 42 and the isolation element 60 from the battery monitoring circuits 21, 31. The measurement signal includes a signal indicating the measurement result such as the voltage of each of the battery cells 10 of the assembled batteries 21, 31 by the battery monitoring circuits 21, 31. Incidentally, the measurement signal to the microprocessor 9 from the battery monitoring circuit 21 is once transmitted to the battery monitoring circuit 31 as a relay signal via the relay signal transmission path 43, and then is transmitted to the microprocessor 9 from the battery monitoring circuit 31.

The lead-acid battery 11 is connected to the power supply unit 10. The power supply unit 10 outputs a primary-side power Vcc by using the power supplied from the lead-acid battery 11. The primary-side power Vcc is input in the microprocessor 9 and is used as operation power of the microprocessor 9. The primary-side power Vcc is also input to the isolation elements 50, 60, and the isolated power supply 8.

The isolated power supply 8 generates a secondary-side power Vs isolated from the microprocessor 9 by using the primary-side power Vcc supplied from the power supply unit 10. The secondary-side power Vs is supplied to the output side of the isolation element 50 (transmission signal transmission path 41 side) and the input side of the isolation element 60 (reception signal transmission path 42 side) from the isolated power supply 8. Incidentally, secondary-side power Vs is also isolated from the battery monitoring circuits 21, 31.

The isolation element 50 is an element for isolating the microprocessor 9 from the transmission signal transmission path 41, and is configured using a photo coupler, for example.

Internal power supplies 51, 52 are incorporated in the isolation element 50. The internal power supply 51 generates operation power of the input side of the isolation element 50, that is the microprocessor 9 side, by using the primary-side power Vcc supplied from the power supply unit 10. On the other hand, the internal power supply 52 generates operation power of the output side of the isolation element 50, that is the transmission signal transmission path 41 side, by using the secondary-side power Vs supplied from the isolated power supply 8.

The transmission signal transmission path 41 is connected to the microprocessor 9 via the isolation element 50 in the upper level control board 5. The transmission signal transmission path 41 is connected to the battery monitoring circuit 21 via the capacitor for communication 23 in the battery monitoring board 2. That is, the transmission signal transmission path 41 is isolated from the microprocessor 9 by the isolation element 50, and is isolated from the battery monitoring circuit 21 by the capacitor for communication 23. Thus, the electrical potential of the transmission signal transmission path 41 is a floating potential in relation to the electrical potential of the microprocessor 9 and the electrical potential of the battery monitoring circuit 21.

The isolation element 60 is an element for isolating the microprocessor 9 from the reception signal transmission path 42, and is configured using a photo coupler, for example. Internal power supplies 61, 62 are incorporated in the isolation element 60. The internal power supply 61 generates operation power of the output side of the isolation element 60, that is the microprocessor 9 side, by using the primary-side power Vcc supplied from the power supply unit 10. On the other hand, the internal power supply 62 generates operation power of the input side of the isolation element 60, that is the reception signal transmission path 42 side, by using the secondary-side power Vs supplied from the isolated power supply 8.

The reception signal transmission path 42 is connected to the microprocessor 9 via the isolation element 60 in the upper level control board 5. The reception signal transmission path 42 is connected to the battery monitoring circuit 31 via the capacitor for communication 33 in the battery monitoring board 3. That is, the reception signal transmission path 42 is isolated from the microprocessor 9 by the isolation element 60, and is isolated from the battery monitoring circuit 31 by the capacitor for communication 33. Thus, the electrical potential of the reception signal transmission path 41 is a floating potential in relation to the electrical potential of the microprocessor 9 and the electrical potential of the battery monitoring circuit 31.

As described above, the battery system according to the first embodiment of the present invention is configured such that the transmission signal transmission path 41, the reception signal transmission path 42, and the relay signal transmission path 43 are each electrically separated from the battery monitoring circuits 21, 31 and the microprocessor 9. Thus, the potential of each transmission path is a floating potential in relation to each electrical potential of the battery monitoring circuits 21, 31 that are high voltage drive circuits and the electrical potential of the microprocessor 9 that is low voltage drive circuit. Therefore, these transmission paths are prevented from being high voltage, and a safe battery system can be achieved.

According to the first embodiment of the present invention described above, the following effects are achieved.

(1) The transmission signal transmission path 41 and the reception signal transmission path 42 are each isolated from the microprocessor 9 by the isolation elements 50, 60, and are isolated from the battery monitoring circuits 21, 31 by the capacitors for communication 23, 33, respectively. Thus, each electrical potential of the transmission signal transmission path 41 and the reception signal transmission path 42 is a floating potential in relation to the electrical potential of the microprocessor 9 and the electrical potentials of the battery monitoring circuits 21, 31. Since the battery system is configured as such, the safe and highly reliable battery system can be provided.

(2) The relay signal transmission path 43 is isolated from the battery monitoring circuits 21, 31 by the capacitors for communication 23, 33, respectively. Thus, the electrical potential of the relay signal transmission path 43 is a floating potential in relation to the electrical potential of the microprocessor 9 and the electrical potentials of the battery monitoring circuits 21, 31. Since the battery system is configured as such, the safer and more highly reliable battery system can be provided.

(3) In the isolation element 50, the input side is connected to the microprocessor 9 and the output side is connected to the transmission signal transmission path 41. In the isolation element 60, the input side is connected to the reception signal transmission path 42 and the output side is connected to the microprocessor 9. The isolated power supply 8 supplies the secondary-side power Vs isolated from the microprocessor 9 and the battery monitoring circuits 21, 31 to the output side of the isolation element 50 and the input side of the isolation element 60. Since the battery system is configured as such, the output side of the isolation element 50 and the input side of the isolation element 60 can each be operated in a status of being isolated from the microprocessor 9 and the battery monitoring circuits 21, 31. Therefore, when the elements such as the photo couplers that require the operation power are used as the isolation elements 50, 60, each electrical potential of the transmission signal transmission path 41 and the reception signal transmission path 42 can be a floating potential in relation to the microprocessor 9 and the battery monitoring circuits 21, 31. Since it is not required to supply the secondary-side power Vs to the isolation elements 50, 60 from the high voltage drive circuit side, consumption current of each of the battery cells 10 of the battery module 1 can be suppressed and variations in consumption current among the battery cells 10 can be reduced. Furthermore, since the wiring between the battery monitoring boards 2, 3 and the upper level control board 5 can be electrically separated from the high voltage drive circuit, further improvement of safety can be achieved.

Second Embodiment

Figure 2:
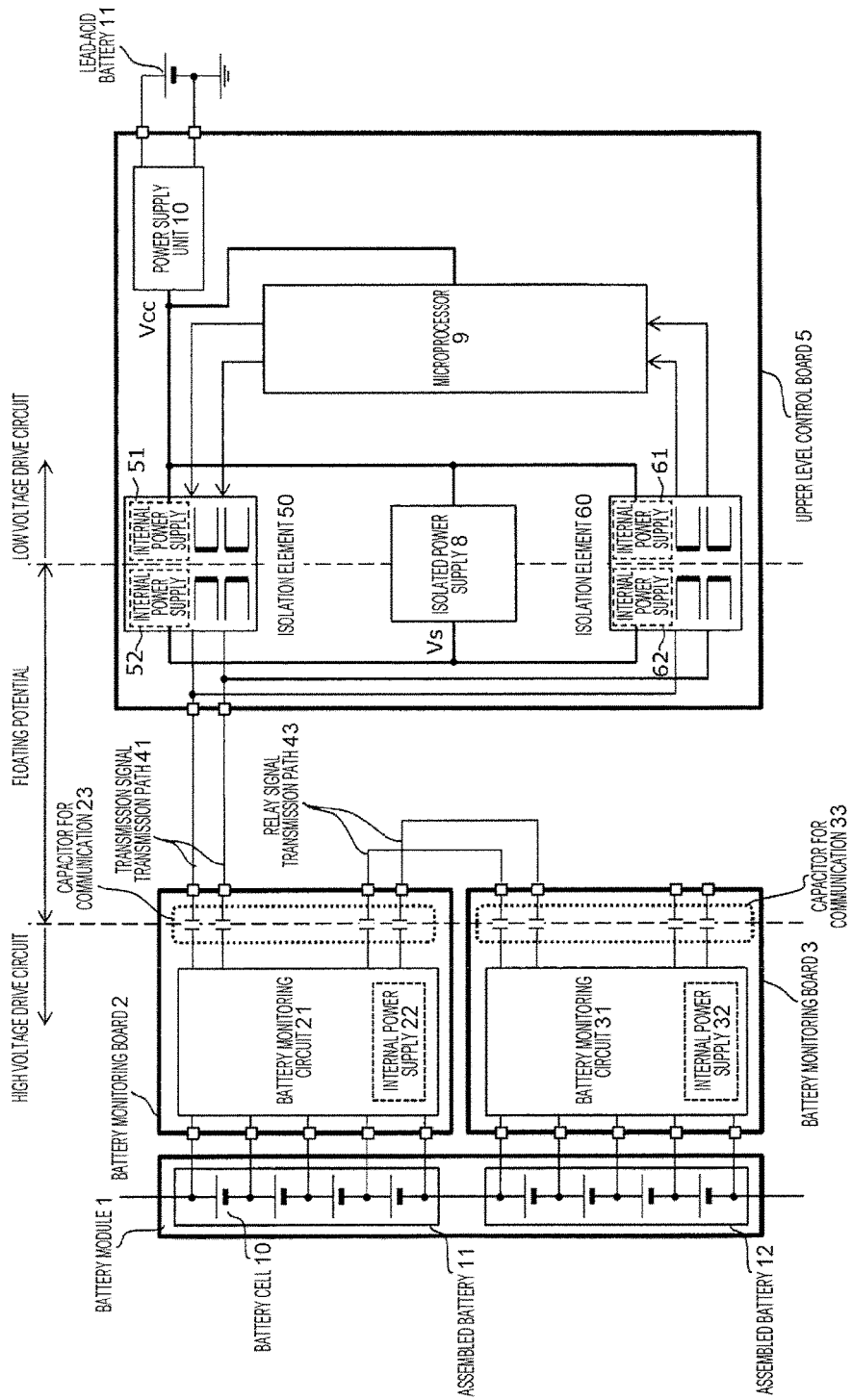
FIG. 2 illustrates a configuration of a battery system according to a second embodiment of the present invention.

Next, a second embodiment of the present invention will be described. FIG. 2 illustrates a configuration of a battery system according to the second embodiment of the present invention. This battery system, comparing to the battery system described in the first embodiment, is different in that the reception signal transmission path 42 is not provided between the battery monitoring board 3 and the upper level control board 5.

In the battery system of this embodiment, the transmission signal transmission path 41 is also connected to the isolation element 60 in addition to the isolation element 50, in the upper level control board 5. Thus, a measurement signal transmitted from the battery monitoring circuits 21, 31 can be received in the microprocessor 9 via the transmission signal transmission path 41 and the isolation element 60.

According to the second embodiment of the present invention described above, the same effects as those described in the first embodiment can be achieved.

Third Embodiment

Figure 3:
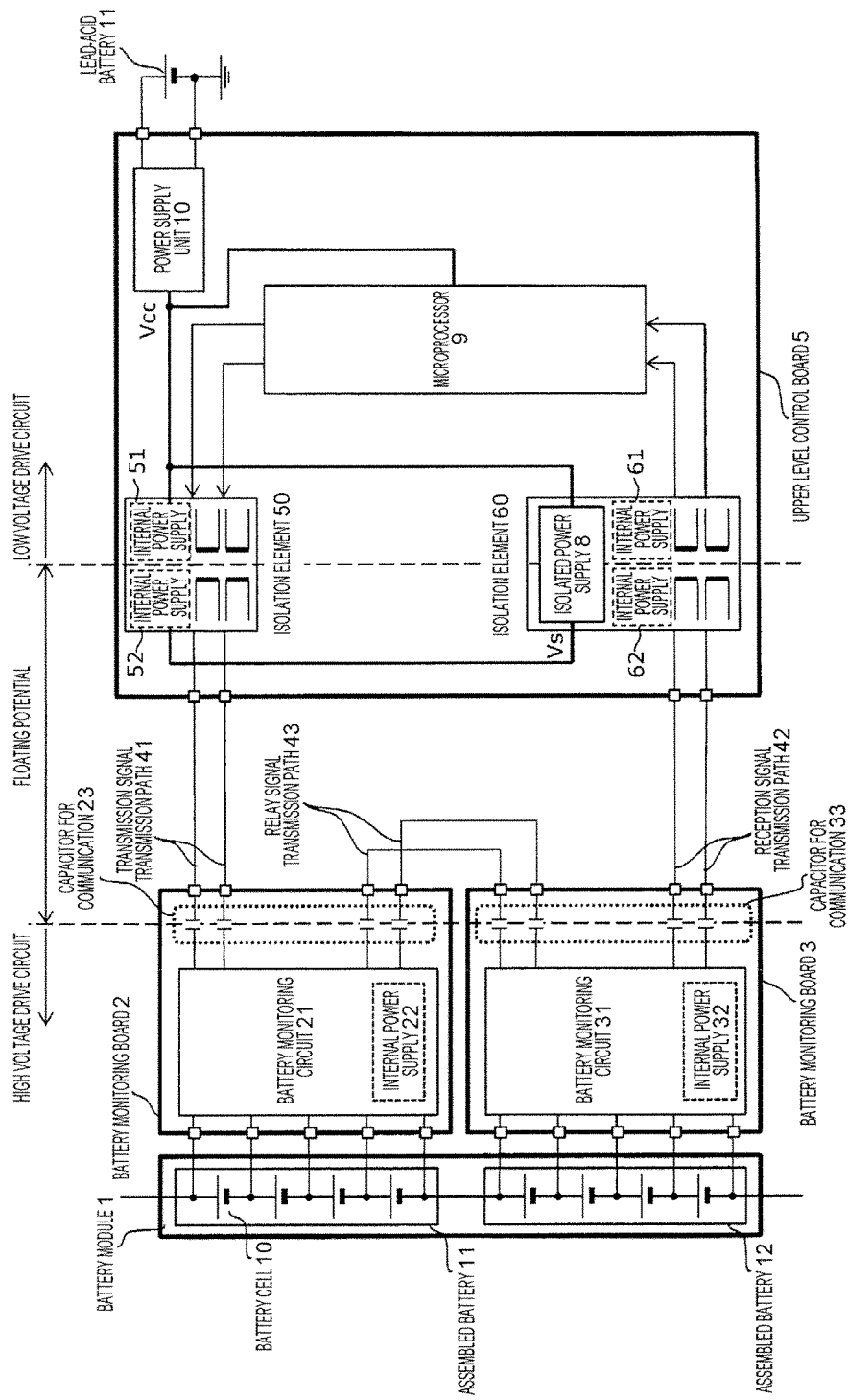
FIG. 3 illustrates a configuration of a battery system according to a third embodiment of the present invention.

Next, a third embodiment of the present invention will be described. FIG. 3 illustrates a configuration of a battery system according to the third embodiment of the present invention. This battery system, comparing to the battery system described in the first embodiment, is different in that the isolated power supply 8 is incorporated in the isolation element 60.

According to the third embodiment of the present invention described above, by incorporating the isolated power supply 8 in the isolation element 60, the number of components of the upper level control board 5 can be reduced and the wiring structure can be simplified. Thus, cost reduction can be achieved. Incidentally, the isolated power supply 8 can be incorporated in the isolation element 50, instead of the isolation element 60. The isolated power supply 8 can be incorporated in both of the isolation element 50 and the isolation element 60.

Fourth Embodiment

Figure 4:
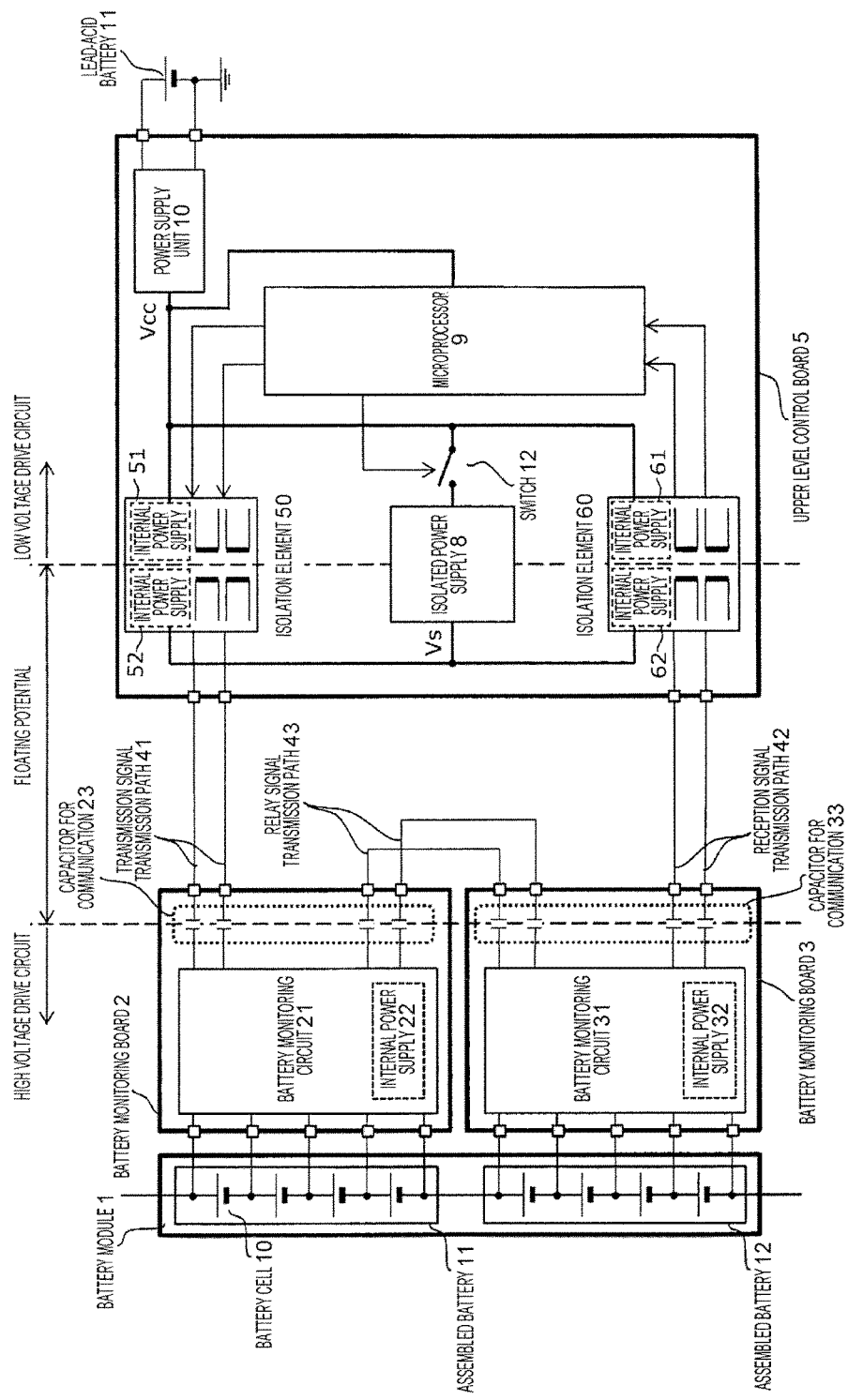
FIG. 4 illustrates a configuration of a battery system according to a fourth embodiment of the present invention.

Next, a fourth embodiment of the present invention will be described. FIG. 4 illustrates a configuration of a battery system according to the fourth embodiment of the present invention. This battery system, comparing to the battery system described in the first embodiment, is different in that a switch 12 is provided between the power supply unit 10 and the isolated power supply 8.

The switch 12 switches an operation status of the isolated power supply 8 by turning on or turning off the supply of the primary-side power Vcc to the isolated power supply 8 from the power supply unit 10 depending on controlling of the microprocessor 9. For example, at the timing to perform communication between the microprocessor 9 and the battery monitoring circuits 21, 31, the switch 12 is made to be the conductive status to operate the isolated power supply 8, and the secondary-side power Vs is supplied to the isolation elements 50, 60 from the isolated power supply 8. At the other cases, the switch 12 is switched to the cut-off status to stop the operation of the isolated power supply 8. In this way, the isolated power supply 8 can be operated only when required.

According to the fourth embodiment of the present invention described above, the operation status of the isolated power supply 8 can be switched by the switch 12 depending on the controlling of the microprocessor 9. Thus, reduction of the power consumption can be achieved by operating the isolated power supply 8 only when required.

Incidentally, in each of the first to fourth embodiments described above, although examples have been described that the isolation elements 50, 60 are operated by receiving the secondary-side power Vs supplied from the isolated power supply 8, an element operable without receiving supply of power can be used as the isolation elements 50, 60. For example, passive elements such as capacitors and pulse transformers can be used as the isolation elements 50, 60. In this case, the isolated power supply 8 is not required in the upper level control board 5. The capacitor for communication 23 in the battery monitoring board 2 and the capacitor for communication 33 in the battery monitoring board 3 can be replaced to the other isolation element such as pulse transformers and photo couplers, for example.

Each of above-described embodiments and modifications is only an example, and unless the features of the invention are impaired, the present invention is not limited to these contents.

The invention claimed is:

1. A battery system, comprising:
 a battery module in which a plurality of assembled batteries each having a plurality of battery cells are connected;
 a plurality of battery monitoring circuits that are each provided so as to correspond to each of the assembled batteries of the battery module and each monitor a status of each of the battery cells of each of the assembled batteries; and
 a plurality of boards, wherein:
 the plurality of battery monitoring circuits are each provided on each of the plurality of boards which are different from each other;
 the plurality of boards each include a capacitor;
 the plurality of battery monitoring circuits are connected via the capacitor and a relay signal transmission path; and
 an electrical potential of the relay signal transmission path is a floating potential in relation to electrical potentials of the battery monitoring circuits.

2. The battery system according to claim 1, further comprising
 a control circuit for controlling each of operations of the plurality of battery monitoring circuits;
 a transmission/reception signal transmission path for transmitting signals that are input and output between the plurality of battery monitoring circuits and the control circuit; and
 an isolation element connected to the control circuit, wherein:
 the transmission/reception signal transmission path is isolated from the control circuit by the isolation element and is isolated from the battery monitoring circuit by the capacitor; and
 an electrical potential of the transmission/reception signal transmission path is a floating potential in relation to the electrical potential of the control circuit and the electrical potentials of the battery monitoring circuits.

3. The battery system according to claim 2, further comprising:
 an isolated power supply for supplying power isolated from the control circuit and the battery monitoring circuits to the isolation element, wherein:
 the isolation element includes an isolation element for transmission in which an input side is connected to the control circuit and an output side is connected to the transmission/reception signal transmission path, and an isolation element for reception in which an input side is connected to the transmission/reception signal transmission path and an output side is connected to the control circuit; and
 the isolated power supply supplies the power to the output side of the isolation element for transmission and the input side of the isolation element for reception.

4. The battery system according to claim 3, wherein the isolated power supply is incorporated in the isolation element.

5. The battery system according to claim 3, further comprising
 a switch circuit for switching an operation status of the isolated power supply depending on controlling of the control circuit.

6. A battery system, comprising:
 a battery module in which a plurality of assembled batteries each having a plurality of battery cells are connected;
 battery monitoring circuits that are each provided so as to correspond to each of the assembled batteries of the battery module and each monitor a status of each of the battery cells of each of the assembled batteries;
 a control circuit for controlling operations of the battery monitoring circuits;
 a first signal transmission path for transmitting signals that are input and output between the battery monitoring circuits and the control circuit;
 a first isolation element connected to the control circuit;
 a second isolation element connected to one of the battery monitoring circuits;
 an isolated power supply for supplying power isolated from the control circuit and the battery monitoring circuits to the first isolation element;
 a switch circuit for switching an operation status of the isolated power supply depending on controlling of the control circuit, wherein:
 the first signal transmission path is isolated from the control circuit by the first isolation element and is isolated from the battery monitoring circuit by the second isolation element;
 an electrical potential of the first signal transmission path is a floating potential in relation to an electrical potential of the control circuit and electrical potentials of the battery monitoring circuits;
 the first isolation element includes an isolation element for transmission in which an input side is connected to the control circuit and an output side is connected to the first signal transmission path, and an isolation element for reception in which an input side is connected to the first signal transmission path and an output side is connected to the control circuit; and
 the isolated power supply supplies the power to the output side of the isolation element for transmission and the input side of the isolation element for reception.

* * * * *